United States Patent
Best et al.

(10) Patent No.: US 8,576,374 B2
(45) Date of Patent: Nov. 5, 2013

(54) LITHOGRAPHIC APPARATUS AND METHOD

(75) Inventors: Keith Frank Best, San Jose, CA (US);
Henricus Wilhelmus Maria Van Buel,
's-Hertogenbosch (NL); Cheng-Qun Gui, Best (NL); Johannes Onvlee,
's-Hertogenbosch (NL); Rudy Jan Maria Pellens, Overpelt (BE); Remi Daniel Marie Edart, Veldhoven (NL);
Oleg Viacheslavovich Voznyi,
Eindhoven (NL); Pascale Anne Maury, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 1033 days.

(21) Appl. No.: 12/393,805

(22) Filed: Feb. 26, 2009

(65) Prior Publication Data
US 2009/0237635 A1    Sep. 24, 2009

Related U.S. Application Data

(60) Provisional application No. 61/064,572, filed on Mar. 12, 2008.

(51) Int. Cl.
*G03B 27/68* (2006.01)
*G03B 27/32* (2006.01)

(52) U.S. Cl.
USPC ................................ 355/52; 355/77

(58) Field of Classification Search
USPC .............. 355/53, 67, 77, 52, 55; 356/401
See application file for complete search history.

(56) References Cited

U.S. PATENT DOCUMENTS

| | | | |
|---|---|---|---|
| 5,602,400 A | 2/1997 | Kawashima | |
| 5,659,384 A | 8/1997 | Ina | |
| 6,163,366 A * | 12/2000 | Okamoto et al. | 355/53 |
| 6,501,189 B1 | 12/2002 | Kim et al. | |
| 6,639,677 B1 | 10/2003 | Ina et al. | |
| 6,876,946 B2 * | 4/2005 | Yasuda et al. | 702/152 |
| 7,038,777 B2 | 5/2006 | Kim et al. | |
| 7,528,966 B2 * | 5/2009 | Matsumoto | 356/614 |
| 2003/0053060 A1 | 3/2003 | Kim et al. | |
| 2008/0259297 A1 * | 10/2008 | Kawakubo | 355/52 |

FOREIGN PATENT DOCUMENTS

| | | |
|---|---|---|
| EP | 1 091 255 | 4/2001 |
| JP | 6-120115 | 4/1994 |
| JP | 6-236837 | 8/1994 |
| JP | 6-302499 | 10/1994 |
| JP | 2000-200751 | 7/2000 |
| JP | 2001-093807 | 4/2001 |
| JP | 2001-110697 | 4/2001 |
| JP | 2001-195583 | 7/2001 |
| JP | 2002-025888 | 1/2002 |

OTHER PUBLICATIONS

Japanese Office Action dated Nov. 29, 2011 in corresponding Japanese Patent Application No. 2009-051499.

* cited by examiner

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

According to a first aspect of the invention, there is provided a lithographic method of providing an alignment mark on a layer provided on a substrate, the method including providing the alignment mark on an area of the layer which is oriented within a certain range of angles with respect to a surface of the substrate on which the layer is provided.

6 Claims, 6 Drawing Sheets

LITHOGRAPHIC APPARATUS AND METHOD

CROSS-REFERENCE TO RELATED APPLICATION

This application claims priority and benefit under 35 U.S.C. §119(e) to U.S. Provisional Patent Application No. 61/064,572, entitled "Lithographic Apparatus and Method", filed on Mar. 12, 2008. The content of that application is incorporated herein in its entirety by reference.

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In order to create, for example, a device on the substrate, it is often necessary to apply a plurality of patterns to a target portion of the substrate. The plurality of patterns may be overlaid on top of one another. In order for the resultant device to work correctly, the patterns must be overlaid on top of one another with a certain degree of accuracy. This is known as an overlay requirement. Any errors in the positioning of overlaid patterns are known as overlay errors.

Patterns are overlaid on top of one another using alignment marks located on or in one or more patterns or layers previously applied to the substrate. The accuracy with which patterns are overlaid is therefore dependent upon the accurate positioning of alignment marks, and also the accurate determination of the positions of those alignment marks when using the alignment mark as a reference (or guide) for the application and positioning of subsequently applied patterns. If the alignment marks are not located on a surface which is level with respect to the substrate surface, but is instead oriented at an angle with respect to the substrate surface, the determination of the positions of the alignment marks may be adversely effected. This may lead to an increase in the overlay error of subsequently applied patterns. Similarly, changes in the thickness of layers covering an alignment mark may also lead to an inaccurate determination of the position of the alignment mark, and therefore an increase in the overlay error. The error will be proportional to an angle at which a radiation beam is incident on the layer, and which is used to determine the position of the alignment mark.

It is desirable to provide, for example, a lithographic apparatus and method that obviates or mitigates one or more of the problems of the prior art, whether identified herein or elsewhere.

SUMMARY

According to a first aspect of the invention, there is provided a lithographic method of providing an alignment mark on a layer provided on a substrate, the method comprising: providing the alignment mark on an area of the layer which is oriented within a certain range of angles with respect to a surface of the substrate on which the layer is provided.

According to a second aspect of the invention, there is provided a lithographic apparatus comprising: an illumination system for providing a beam of radiation; a support structure for supporting a patterning device, the patterning device serving to impart the radiation beam with a pattern in its cross-section; a substrate table for holding a substrate; and a projection system for projecting the patterned radiation beam onto a target portion of the substrate; and a controller arranged to control at least a part of the lithographic apparatus to ensure that an alignment mark that is to be provided on an area of a layer provided on the substrate is provided on an area which is oriented within a certain range of angles with respect to a surface of the substrate on which the layer is provided.

According to a third aspect of the invention, there is provided a lithographic method of using an alignment mark provided on a first layer which has been provided on a substrate, the method comprising: using an alignment mark provided on the first layer which is oriented within a certain range of angles with respect to a surface of the substrate on which the first layer is provided; and not using an alignment mark provided on the first layer which is oriented outside of a certain range of angles with respect to a surface of the substrate on which the first layer is provided.

According to a fourth aspect of the invention, there is provided a lithographic apparatus comprising: an illumination system for providing a beam of radiation; a support structure for supporting a patterning device, the patterning device serving to impart the radiation beam with a pattern in its cross-section; a substrate table for holding a substrate; and a projection system for projecting the patterned radiation beam onto a target portion of the substrate; and a controller arranged to control at least a part of the lithographic apparatus to ensure that, in use: an alignment mark which is provided on a first layer provided on the substrate, and which is oriented within a certain range of angles with respect to a surface of the substrate on which the first layer is provided, is used; and an alignment mark which provided on the first layer provided on the substrate, and which is oriented outside of a certain range of angles with respect to a surface of the substrate on which the first layer is provided, is not used.

According to a fifth aspect of the invention, there is provided a lithographic method of using an alignment mark provided on a first layer which has been provided on a substrate, the method comprising: controlling at least a part of a lithographic apparatus to take into account the angle at which the alignment mark is oriented with respect to a surface of the substrate on which the first layer is provided when using the alignment mark.

According to a sixth aspect of the invention, there is provided a lithographic apparatus comprising: an illumination system for providing a beam of radiation; a support structure for supporting a patterning device, the patterning device serving to impart the radiation beam with a pattern in its cross-section; a substrate table for holding a substrate; and a projection system for projecting the patterned radiation beam onto a target portion of the substrate; and a controller arranged to control at least a part of the lithographic apparatus to take into account an angle of orientation of an alignment mark which has been provided on a first layer provided on the substrate, with respect to a surface of the substrate on which the layer is provided, when using the alignment mark.

According to a seventh aspect of the invention, there is provided a lithographic method of using an alignment mark provided on a first layer which has been provided on a substrate, the alignment mark being covered by a second layer, the method comprising: controlling constituent parts of a lithographic apparatus to take into account the thickness of the second layer when determining a position of the alignment mark.

According to an eight aspect of the invention, there is provided a lithographic apparatus comprising: an illumination system for providing a beam of radiation; a support structure for supporting a patterning device, the patterning device serving to impart the radiation beam with a pattern in its cross-section; a substrate table for holding a substrate; and a projection system for projecting the patterned radiation beam onto a target portion of the substrate; and a controller arranged to control at least a part of the lithographic apparatus to take into account the thickness of a second layer of material provided on the substrate when determining a position of an alignment mark, the alignment mark being provided on a first layer provided on the substrate and covered by the second layer.

According to an ninth aspect of the invention, there is provided a lithographic method of using an alignment mark provided on a first layer which has been provided on a substrate, the alignment mark being covered by a second layer, the method comprising: controlling constituent parts of a lithographic apparatus to take into account a refractive index of the second layer when determining a position of the alignment mark.

According to a tenth aspect of the invention, there is provided a lithographic apparatus comprising: an illumination system for providing a beam of radiation; a support structure for supporting a patterning device, the patterning device serving to impart the radiation beam with a pattern in its cross-section; a substrate table for holding a substrate; and a projection system for projecting the patterned radiation beam onto a target portion of the substrate; and a controller arranged to control at least a part of the lithographic apparatus to take into account the refractive index of a second layer of material provided on the substrate when determining a position of an alignment mark, the alignment mark being provided on a first layer provided on the substrate and covered by the second layer.

According to an eleventh aspect of the invention, there is provided a device manufacturing method, comprising using the methods according to any of the preceding aspects of the present invention.

According to a twelfth aspect of the invention, there is provided a device manufactured according to the above-referenced device manufacturing method and/or by the above-referenced lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
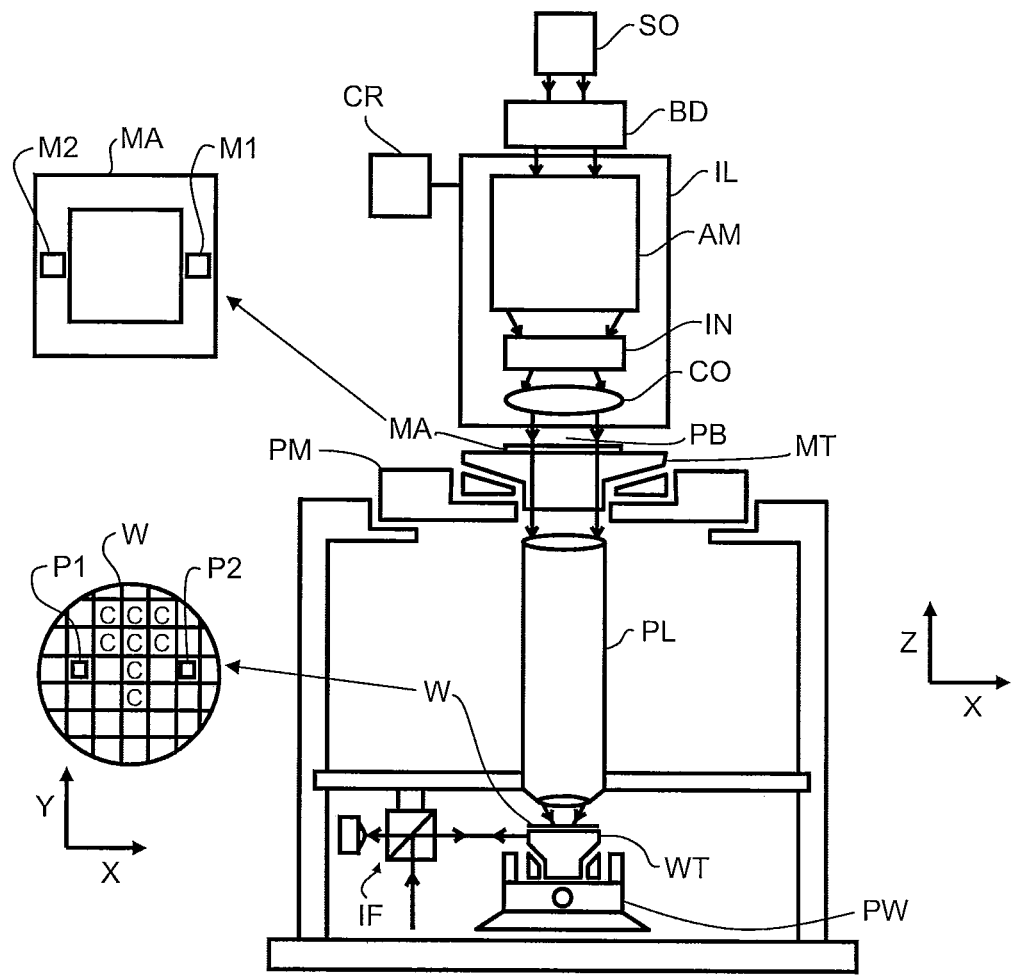
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:
an illumination system (illuminator) IL to condition a beam PB of radiation (e.g., UV, DUV or EUV radiation).
a support structure (e.g., a support structure) MT to support a patterning device (e.g., a mask) MA and connected to first positioning device PM to accurately position the patterning device with respect to item PL;
a substrate table (e.g., a wafer table) WT for holding a substrate (e.g., a resist-coated wafer) W and connected to second positioning device PW for accurately positioning the substrate with respect to item PL;
a projection system (e.g., a refractive projection lens) PL configured to image a pattern imparted to the radiation beam PB by patterning device MA onto a target portion C (e.g., comprising one or more dies) of the substrate W; and
a controller CR for controlling at least a part of the lithographic apparatus to take into account changes in the thickness or refractive index of one or more layers provided on a layer that contains an alignment mark, or the flatness of those layers, or the flatness of a layer containing the alignment mark.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

When creating a device on a substrate, it is often necessary to apply to the substrate a number of successively applied and overlaid patterns. Patterns are overlaid on top of one another using alignment marks previously applied to layers of material already provided on the substrate. Errors in the positioning of successively applied and overlaid patterns are known as overlay errors. Overlay errors can arise for one of a number of reasons, including inaccurate positioning of apparatus holding the substrate, inaccurate projection of the radiation beam onto the substrate, deformation of the patterning device etc. Another contribution to overlay error is when the position of previously applied alignment marks is inaccurately determined. The positions of previously applied alignment marks can be inaccurately determined for a number of reasons, as described in more detail below.

Figure 2A:
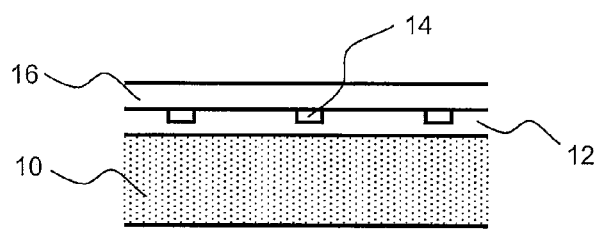
FIGS. 2a to 2e schematically depict variations in the thickness or flatness of layers that have been provided on a substrate.

FIG. 2a depicts a substrate 10 upon which a first layer of material 12 has been provided. The first layer of material 12 has been provided with a plurality of alignment marks 14. A second layer of material 16 is then provided on top of the first layer of material 12. The first and second layers 12, 14 may eventually form part of, for example, a thin film head of a hard disk drive or the like. The first and second layers 12, 14 may, for example, be $Al_2O_3$ layers.

A pattern may be applied to the second layer of material 16, and the pattern may be positioned relative to previously applied patterns using alignment marks 14 provided in the first layer 12. As can be seen from FIG. 2a, the surfaces of the first layer 12 and second layer 16 are level with that of the substrate 10. Also, it can be seen that the thickness of the first layer 12 and second layer 16 are the same as each other. Such uniformity allows the position of alignment marks 14 to be accurately and consistently determined, which in turn allows a pattern applied to the second layer 16 to be accurately positioned with little overlay error. However, when the thickness or flatness of layers applied to the substrate 10 is not uniform, it can be more difficult to accurately and consistently determine the position of alignment marks applied, and therefore more difficult to accurately position subsequently applied patterns.

Figure 2B:
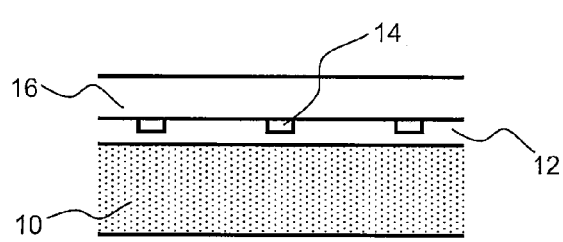
Figure 2C:
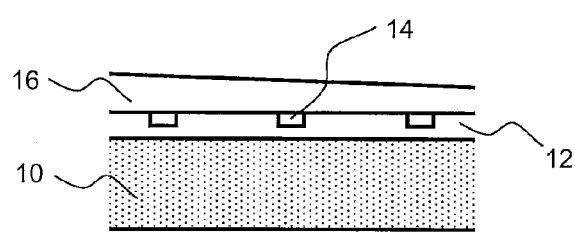
Figure 2D:
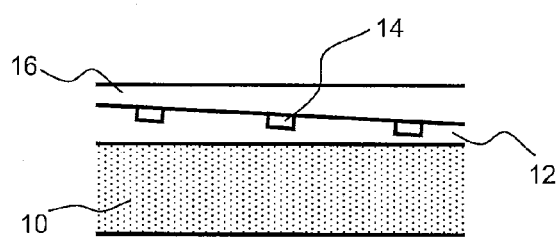

FIGS. 2b to 2e depict different non-uniformities in layers provided on a substrate which may effect the accurate and consistent determination of the position of alignment marks applied to one or more of these layers. FIG. 2b shows that the second layer 16 provided on the substrate 10 is thicker than the first layer 12. FIG. 2c shows that the thickness of the second layer 16 provided on the substrate 10 is not uniform, and that an upper surface of the second layer 16 is not flat with respect to the surface of the substrate 10. FIG. 2d shows that the thickness of the first layer 12 provided on the substrate 10 is not uniform, and that an upper surface of the first layer 12 is not flat with respect to the substrate 10.

Figure 2E:
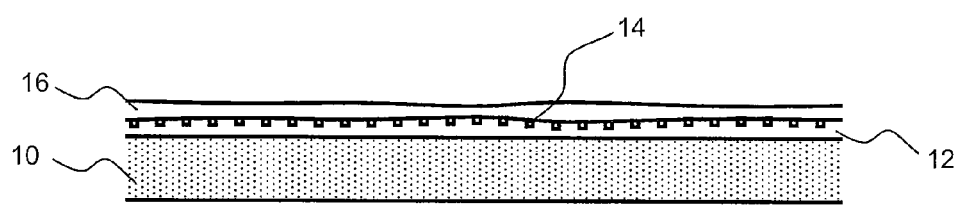

FIG. 2e is a general depiction of how all the non-uniformities depicted in FIGS. 2b to 2d can be present in layers applied to a substrate. It can be seen that the first layer 12 applied to the substrate 10 has a non-uniform thickness, and that an upper surface of the first layer 12 is not flat with respect to the substrate 10. Furthermore, it can be seen that the second layer 16 provided on the substrate 10 also has a non-uniform thickness, and that an upper surface of the second layer 16 is also not flat with respect to the substrate 10.

From a review of FIGS. 2b to 2e, it will be appreciated that non-uniformities in layers provided on the substrate may effect the position or orientation of alignment marks provided in or on those layers, or may effect the thickness of material in a layer above a layer in which or on which the alignment marks are provided. Such non-uniformities can effect the accurate and consistent determination of the position of the alignment marks 14, as will now be described.

Figure 3:
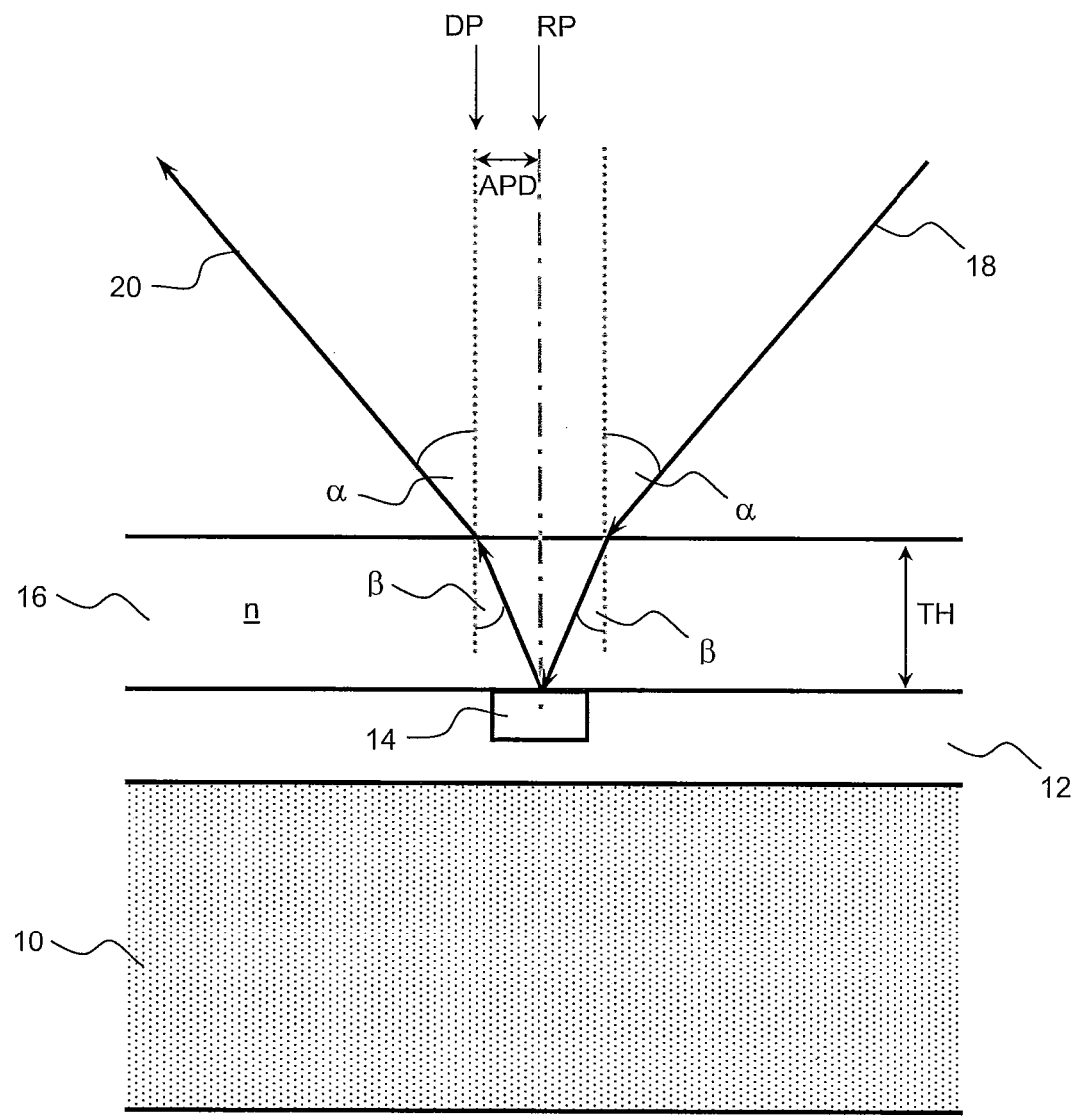
FIG. 3 schematically depicts a method of determining the position of an alignment mark applied to a layer of material provided on a substrate.

FIG. 3 shows the substrate 10 provided with the first layer 12 and the second layer 16. Provided in (or on) the first layer 12 is the alignment mark 14. The Figure schematically depicts how the position of the alignment mark 14 may be determined. An incoming beam of radiation 18 is shown as being incident upon the second layer 16. The angle at which the incoming beam of radiation 18 is incident upon the second layer 16 with respect to a line extending perpendicularly from the surface of the second layer 16 is denoted by $\alpha$. The incoming beam of radiation 18 enters into and passes through the second layer 16, which has a refractive index n. The incoming beam of radiation 18 is refracted by the second layer 16, which affects the angle at which the incoming beam of radiation 18 is incident upon the first layer 12 and alignment mark 14. It can be seen that the angle at which the incoming beam of radiation 18 is incident upon the alignment mark 14 with respect to a line extending perpendicularly from the first layer 12 and alignment mark 14 is denoted as $\beta$. Upon reflection from the alignment mark 14, the incoming beam of radiation 18 becomes an outgoing beam of radiation 20. It can be seen that the outgoing beam of radiation 20 is substantially symmetrical to the incoming beam of radiation 18. The outgoing radiation 20 is thus reflected from the alignment mark 14 at an angle $\beta$ with respect to a line extending perpendicularly from the alignment mark 14. After the outgoing beam of radiation 20 has left the second layer 16, it is refracted such that it leaves the second layer 16 at a different angle, specifically $\alpha$ with respect to a line extending perpendicularly from the surface of the second layer 16.

The incoming beam of radiation 18 and the outgoing beam of radiation 20 may be used to determine the position of the alignment mark 14. An alignment system which provides and detects the incoming beam of radiation 18 and outgoing beam of radiation 20 will usually be configured to have a focal plane which coincides with an upper surface of the second layer 16 (i.e., the uppermost surface of the layers provided on the substrate). It can be seen from the Figure that the real position of the alignment mark 14 is denoted by RP. However, due to the incoming beam of radiation 18 and outgoing of beam of radiation 20 having to reflect off, refract and pass through the first and second layers 12, 16, the determined position DP of the alignment mark 14 has deviated APD from the real position RP (APD being indicative of the alignment position deviation). In some alignment systems, the incoming beam of radiation is controlled to be as orthogonal as possible to the uppermost surface of the layers provided on the substrate, thus minimizing the deviation APD between the determined position DP of the alignment mark 14 and the real position RP. However, it is often difficult or impossible to ensure that the incoming beam of radiation is as orthogonal to the uppermost surface. This means that the incoming beam of radiation will nearly always be incident at a slight angle to a line extending perpendicularly from the uppermost surface. In summary, and for example using the method as shown in FIG. 3, the determined position of an alignment mark will not equate to the real position of the alignment mark.

If the deviation APD shown in FIG. 3 was not corrected for, patterns applied to layers provided on the substrate using the determined position DP of the alignment mark 14 as a guide or reference point may be inaccurately applied, causing overlay errors. In order to compensate for the deviation APD in the determined alignment mark position, DP, the deviation APD can be taken into account when positioning the substrate or elements of lithographic apparatus to provide an overlaid pattern. For instance, it can be appreciated from the Figure that:

$$APD \approx TH(\alpha/n)$$

Where TH is the thickness of the second layer 16. If the thickness TH of the second layer 16 is constant, as well as the refractive index n and the angle of incidence of the incoming beam of radiation 18, the deviation APD in the determined position DP of the alignment mark 14 will also be constant and consistent across the substrate 10. This means that when applying a pattern to layers provided on the substrate 10 using the determined position DP of the alignment marks, the deviation APD can be accounted for by, for example, moving one or more elements by an amount which is proportional to or corresponds to the deviation APD.

Although the method described in relation to FIG. 3 works in some circumstances, it does not always work. As mentioned above, in order to account for the deviation APD in the determined position DP of the alignment mark 14, it is assumed that the following are constant across the substrate: the thickness TH of the second layer 16; the angle of incidence $\alpha$ of the incoming beam of radiation 18; and the refractive index of the second layer 16. In practice, however, these factors are not always constant. For instance, while the refractive index may not vary that much (if at all), the thickness of layers provided on the substrate can vary, as can the topography of the layers (which affects the angle of incidence of the incoming beam of radiation 18). Such variations (or in other words, non-uniformities) mean that there is not a constant deviation APD across the substrate (and between different substrates). Since the deviation APD is not constant, a constant correction for the deviation APD will lead to overlay errors.

Figure 4:
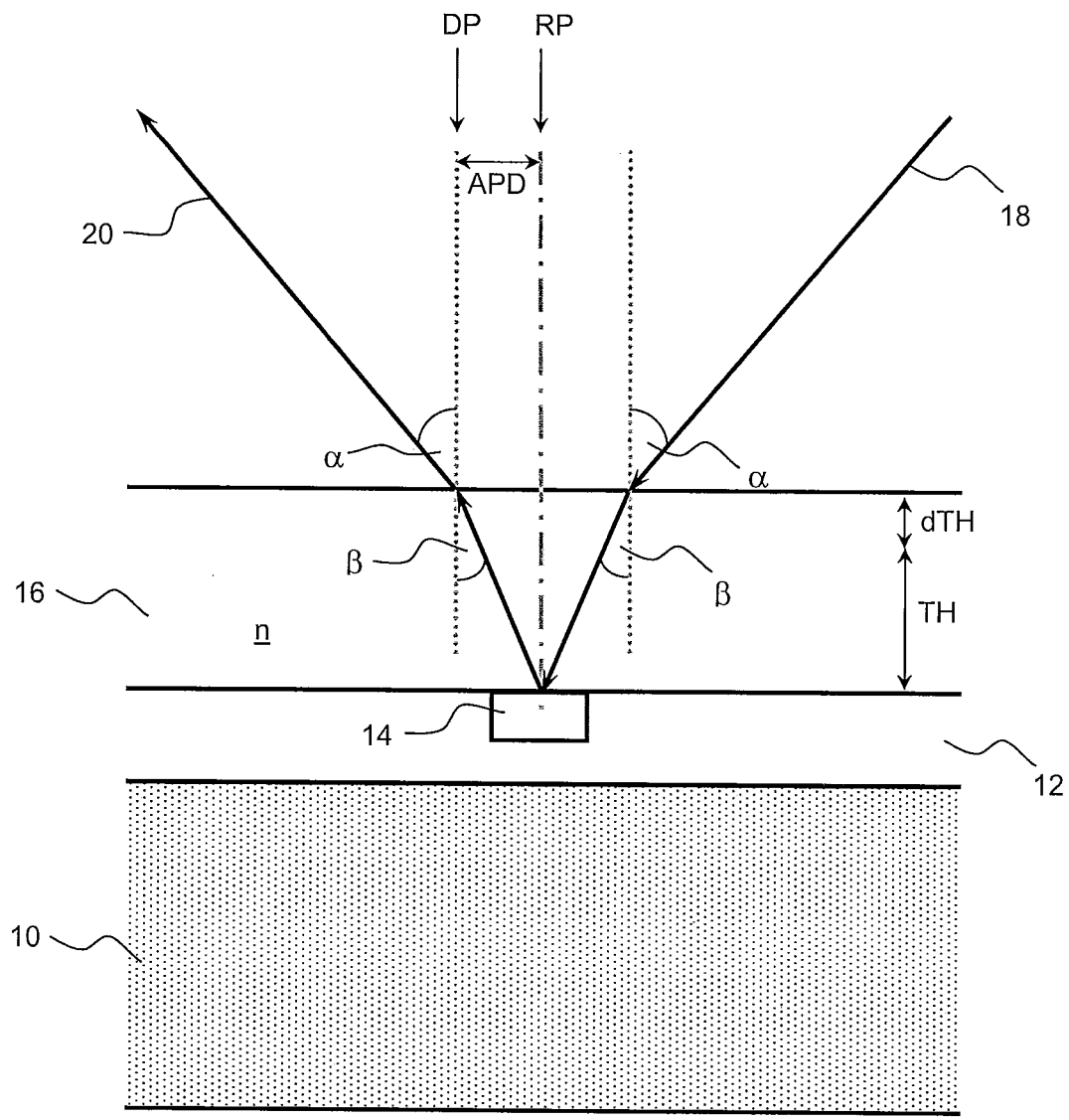
FIG. 4 schematically depicts a variation in the determined position of an alignment mark as a consequence of a change in thickness of a layer of material covering the alignment mark.

FIG. 4 depicts a situation where the thickness of the second layer 16 is greater, for example, than intended by an amount dTH. The thickness variation dTH may arise due to processing conditions, for example spin coating anomalies or chemical or mechanical polishing inconsistencies. In order to determine the position of the alignment mark 14, the same method is undertaken as described above in relation to FIG. 3. The difference in relation to the arrangement of FIG. 4 is that the second layer 16 through which the incoming beam of radiation 18 and outgoing beam of radiation 20 pass is greater in thickness by an amount dTH. This has the effect that the deviation APD between the determined position DP and real position RP of the alignment mark 14 is increased. For instance, it can be seen that, in FIG. 4:

$$APD \approx (TH + dTH)\alpha/n$$

Or in other words, in comparison with FIG. 3, the deviation APD has increased by an amount:

Increase in $APD \approx (dTH)\alpha/n$

If the change in thickness dTH was constant across the second layer 16, then, once again, a correction taking into account the deviation APD would be constant across the substrate and second layer 16. However the change in thickness is unlikely to be constant, and may change across the substrate due to, for example, processing conditions such as spinning deposition effects, or mechanical or chemical polishing processes. This means that the deviation APD that needs to be corrected for will not in fact be constant across the substrate 10. A constant correction for an expected constant deviation APD may mean that, in practice overlay errors arise, and to different extents, across the substrate (and across different substrates).

Figure 5:
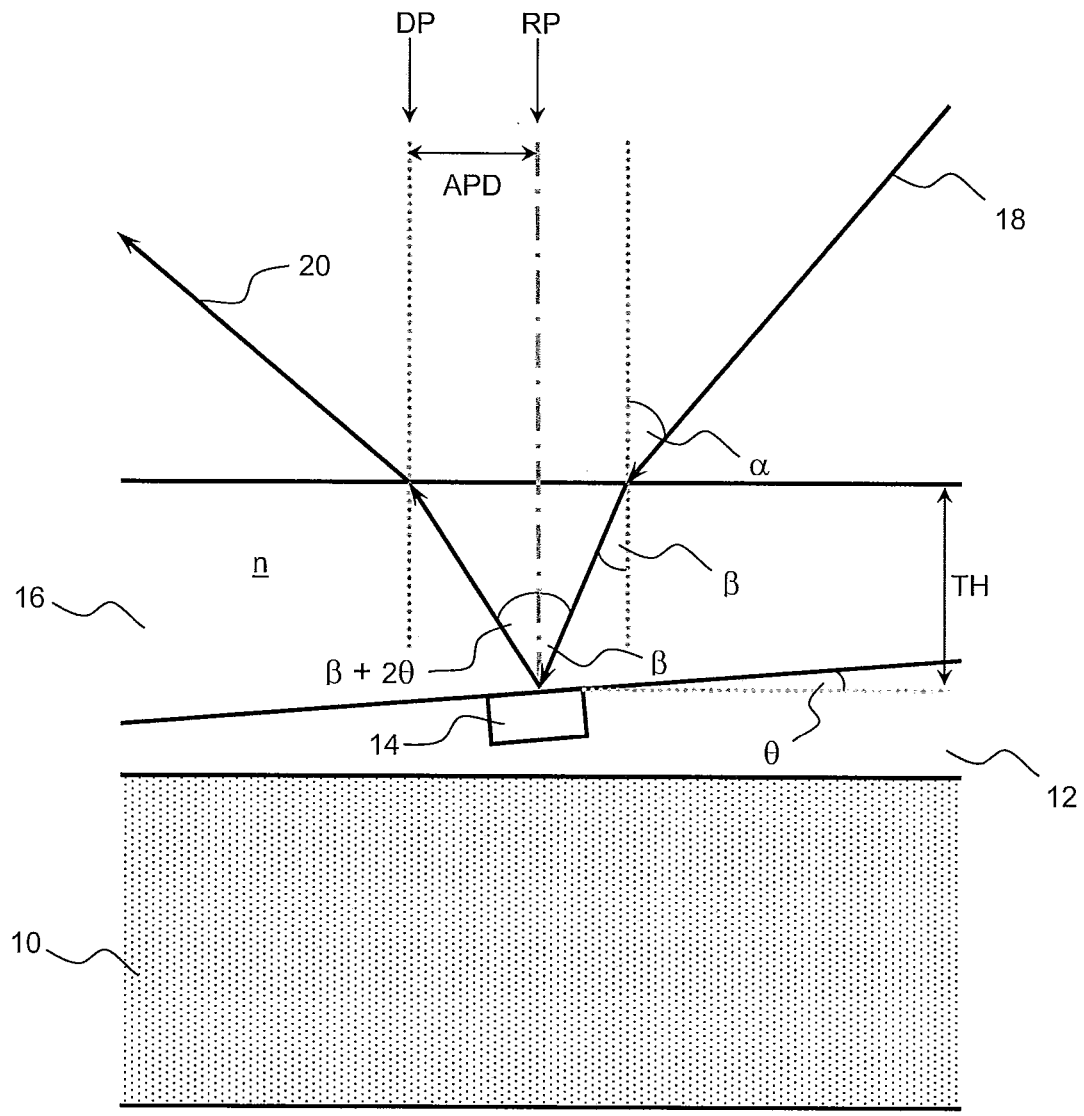
FIG. 5 schematically depicts a change in the determined position of an alignment mark as a consequence of a layer of material in or on which the alignment mark has been provided not being flat with respect of the substrate.

FIG. 5 shows a situation where the first layer 12 has a thickness which is not uniform across the substrate 10, and where an upper surface of the first layer 12 is not flat relative to an upper surface of the substrate 10. Such a non-uniformity may arise due to processing conditions, for example spin coating anomalies or chemical or mechanical polishing inconsistencies The determination of the position DP of the alignment mark 14 is determined in the same way as described above in relation to FIGS. 3 and 4. However, due to the fact that the thickness of the first layer 12 varies across the substrate 10, an upper surface of the first layer 12 is not flat in comparison with an upper surface of the substrate 10. In other words, the alignment mark 14, which is provided on the first layer 12, does also not lie flat with respect to the surface of the substrate. This means that the angle at which the incoming beam of radiation 10 reflects off the alignment mark 14 will be different than if the alignment mark 14 was located on a flat surface with respect to the substrate 10. For instance, it can be seen in the Figure than an upper surface of the first layer 12 is not parallel to the substrate 10, but instead lies at an angle $\theta$. It can be seen that because the alignment mark 14 lies at an angle $\theta$ with respect to the substrate 10, the alignment mark 14 will reflect the outgoing beam of radiation 18 at a greater angle than if the alignment mark 14 laid parallel to the substrate 10. For instance, it can be seen that the incoming beam of radiation 10 is incident at an angle $\beta$ with respect to a line extending perpendicularly from the substrate 10. Instead of the outgoing beam of radiation 18 being reflected at the same angle $\gamma$ (as is in the case in FIG. 3), the outgoing beam of radiation 18 is instead reflected at an angle $\gamma + 2\theta$. Because the angle at which the outgoing beam of radiation 18 is reflected off the alignment mark 14 increases, so does the deviation APD between the determined position DP of the alignment mark 14 and the real position RP of the alignment mark 14. Specifically, it can be seen that:

$$APD \approx TH(\alpha/n + 2\theta)$$

It can therefore be seen that when one or more layers with which the substrate is provided is either not uniform in thickness, or does not lie flat with respect to the substrate, and these non-uniformities vary across the substrate, the deviation APD between the determined position DP and the real position RP of the alignment mark 14 will also vary across the substrate.

In order to ensure that patterns can be accurately and consistently overlaid, it is desirable to ensure that the position of alignment marks can be accurately determined, or accurately compensated for if the determined position is known to deviate from the real position.

Figure 6:
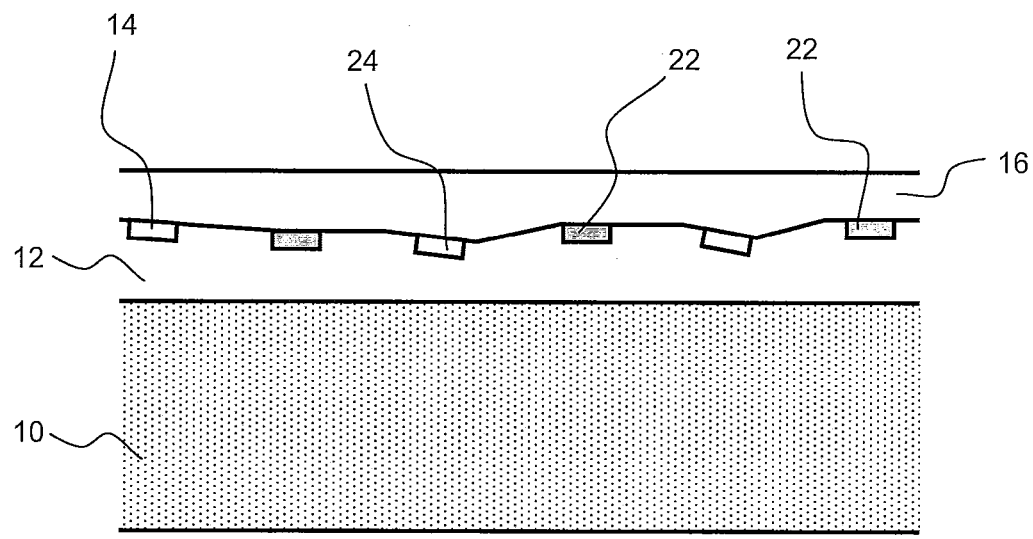
FIG. 6 schematically depicts an alignment method in accordance with a first embodiment of the present invention.

One solution to the problems of variation in the determined position of the alignment mark is to ensure that only alignment marks which are in or on surfaces which are parallel to (or in other words flat with respect to) the substrate are used to determine the position of overlaid patterns. This can be achieved in one of two ways. FIG. 6 shows the substrate 10 provided with the first layer 12 and the second layer 16. Provided in the first layer 12 are a plurality of alignment marks 14. By determining the position of the alignment marks 14, it can be determined whether or not the alignment marks 14 are located in or on a surface which is parallel to the substrate 10. For instance, if a thickness of the second layer 16 covering the alignment marks 14 is relatively constant, changes in the determined position of the alignment marks 14 will reflect a change in their orientation with respect to the substrate 10, as described in more detail in FIG. 5. Therefore, by determining the position of the alignment marks 14, only alignment marks 14 which are flat with respect to the substrate 10 (or alignment marks which are oriented within a specific range of angles within respect of the substrate) may be used to align subsequently applied patterns. For instance, it can be seen in FIG. 6 that a plurality of alignment marks 22 are flat enough to be used in subsequent positioning and alignment of subsequently applied patterns, whereas another plurality of alignment marks 24 are not flat enough to be used in subsequent positioning and alignment of subsequently applied patterns. In other words, a sub-set of the plurality of alignment marks 14 provided on the first layer may be used, whereas another sub-set may not.

Figure 7:
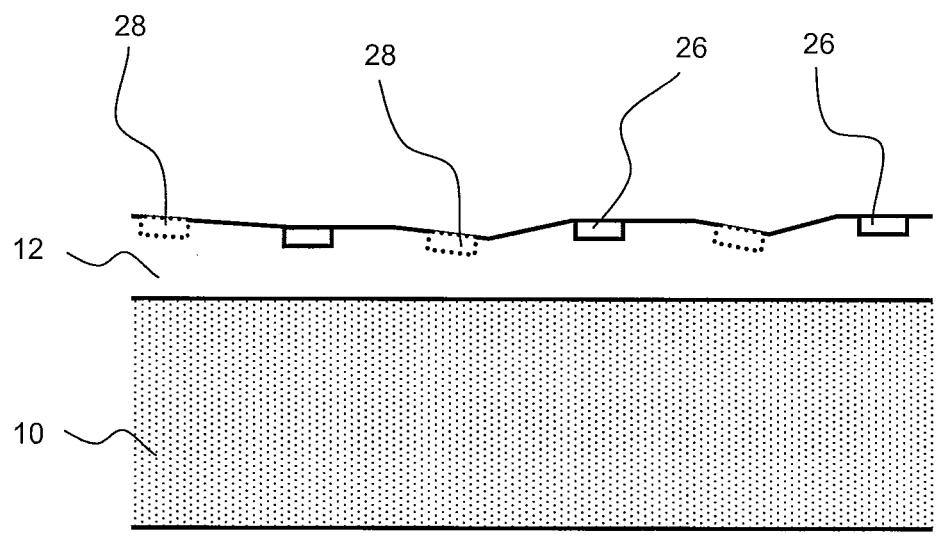
FIG. 7 schematically depicts an alignment method in accordance with another embodiment of the present invention.

FIG. 7 depicts a similar but slightly different approach to that shown in and described with reference to FIG. 6. Instead of choosing which alignment marks are flat enough to be used in the alignment and positioning of subsequently applied patterns (as in the case of FIG. 6), in FIG. 7 alignment marks are only applied in or on a surface which is flat enough with respect to the substrate 10. Referring to FIG. 7, the substrate 10 is provided with the first layer 12. It can be seen that an upper surface or the first layer is not completely flat with respect to the substrate 10, but instead has a non-uniform topography, having some regions which are flat with respect to the substrate 10 and some regions which are not flat with respect to the substrate 10. The flatness of an upper surface of the first layer 12 can be determined using, for example, a level sensor or any other suitable equipment. Alignment marks 26 may be provided in or on areas of the first layer 12 which are deemed to be flat enough with respect to the substrate 10 for use in subsequent alignment and positioning of subsequently applied patterns. Alignment marks are therefore not provided in areas which are deemed not to be flat enough with respect to the substrate 10. Dashed outline features 28 indicated positions of alignment marks that would have been applied (but which have not) if the method according to an embodiment of the present invention had not been applied. It can be seen that the position of these alignment marks 28 would be on or in areas of the first layer 12 which are not flat with respect to the substrate 10, and which would otherwise have resulted in different and varying deviations in the determined position of alignment marks, making it more difficult to apply subsequently applied overlaid patterns. Because these alignment marks 28 are not used, subsequently applied patterns positioned using the flat alignment marks 26 may be positioned more accurately with less overlay error.

Instead of choosing which alignment marks to use in the positioning or alignment of subsequently applied patterns, or only applying alignment marks to areas which are flat enough with respect to the substrate, the lithographic apparatus can be controlled to take into account changes in surface flatness, layer thickness, or changes in the orientation of alignment marks. This may be achieved in any one of a number of ways. For instance, if it is desired to determine the topography of an uncovered surface on which alignment marks are provided, the level sensor or other scanning arrangement may be used to determine the topography. If the layer upon which alignment marks are provided is located beneath another layer, the topography may be determined by a combination of one or more measurements. For instance, the topography of an upper surface of the overlying layer can be determined using a level sensor, and alignment system or a scanning arrangement, and the thickness of the overlying layer can be determined in a manner known in the art (for example, using ellipsometry, scatterometry or the like). By combining these topography and thickness measurements, it will be possible to determine the topography of an upper surface of an underlying layer, for example one on which the alignment marks are provided. The topography of the layer upon which the alignment marks are provided may be determined without determining the thickness or topography of an overlying layer. For instance, even though the alignment marks may lie at different angles with respect to the substrate, it will be known that that alignment marks are located in certain positions across the substrate. Therefore, when determining the position of these alignment marks using the method described above, the deviation in the position of each alignment mark due to, for example, non-uniformity in a surface upon which the alignment marks are provided may be used to determine how far the determined positions of the alignment marks deviate from the real or expected positions. These deviations will allow a map of the topography of the surface on or in the alignment marks are provided to be calculated and corrected for by, for example, changing the configuration of one or more elements of the lithographic apparatus.

By only using or providing alignment marks which are readily flat with respect to the substrate, or by adjusting the configuration of the lithographic apparatus (for example, changing the orientation of the substrate or properties of the radiation beam) to take into account non-uniformities in the thicknesses or flatnesses of layers provided on the substrate, overlay errors can be reduced.

In the above embodiments, it has been stated that alignment marks may only be used or provided on surfaces which are flat enough with respect to the surface of the substrate. This means that the alignment marks may not be perfectly flat with respect to the substrate, but can be oriented within a certain range of angles with respect to the substrate. The range of angles which that are specified as acceptable will correspond to the overlay errors which are acceptable in the corresponding patterns or devices provided or created by the lithographic apparatus. For instance, it may be desirable to use or provide alignment marks on a surface which is oriented at no more than a few micro radians with the respect to the substrate. The alignment marks may be oriented at 0 to 300 µrad with respect to the substrate. More particularly, the alignment marks may be oriented at 0 to 50 µrad with respect to the substrate. This requirement may be predetermined, or may be specified on the fly in accordance with a particular process, batch, or other machine or workpiece condition.

In the above embodiments, the refractive index n of a layer has been described. It will be appreciated from the equations given above that if the refractive index changes, so will the deviation APD of the determined position of an alignment mark from the real position. Therefore, changes in the refractive index of a layer can also induce or cause changes in the overlay errors. The refractive index of a layer provided on top of a layer on or in which alignment marks are provided can be determined. The refractive index, or changes in the refractive index, can then be taken into account when determining the position of an alignment mark, and applying patterns to the uppermost layer. In other words, according to an embodiment of the present invention, there is provided a lithographic method of using an alignment mark provided on a first layer which has been provided on a substrate, the alignment mark being covered by a second layer, the method comprising: controlling constituent parts of a lithographic apparatus to take into account the refractive index of the second layer when determining a position of the alignment mark.

As mentioned above in relation to FIG. 1, the lithographic apparatus may be provided with a controller CR for controlling at least a part of the lithographic apparatus to take into account changes in the thickness or refractive index or indices of one or more layers provided on a layer that contains an alignment mark, or the flatness of those layers, or the flatness of a layer containing the alignment mark. The controller may be arranged to control the lithographic apparatus to apply alignment marks to a layer in regions where the layer lies within a certain range of angles. The controller may be arranged to control the lithographic apparatus to only use one or more alignment marks in a layer which lie within a certain range of angles. The controller may be arranged to control the lithographic apparatus to take into account the different orientations of the alignment marks, for example the angles at which the alignments marks are oriented. The controller may be arranged to control the lithographic apparatus to take into account the thickness of one or more layers located above a layer provided with one or more alignment marks, in order to more accurately determine the position of those alignment marks. The controller could be a computer, an embedded processor, or other control apparatus. The controller could be provided with information, arranged to receive information, or be arranged to obtain information used to control the lithographic apparatus.

While specific embodiments of the invention have been described above, it will be appreciated that the invention may be practiced otherwise than as described. The description is not intended to limit the invention.

The invention claimed is:

1. A lithographic method of providing alignment marks on a layer provided on a substrate, the method comprising:
   for each of a plurality of potential alignment mark positions on the layer determining respective angles of orientation of the layer with respect to a surface of the substrate;
   determining, for each of the respective angles of orientation, whether the layer is oriented within a specified range of angles with respect to the surface of the substrate at each respective associated potential alignment mark position; and
   providing the alignment marks at each potential alignment mark position for which the layer is oriented within the specified range of angles, and not providing alignment marks on each potential alignment mark position for which the layer is oriented outside the specified range of angles.

2. The method of claim 1, wherein the determining respective angles of orientation comprises determining a topography of at least a part of the layer before the providing.

3. The method of claim 1, wherein the specified range of angles is from 0 to 300 μrad.

4. The method of claim 3, wherein the specified range of angles is 0 to 50 μrad.

5. The method of claim 1, wherein the layer has an uneven surface.

6. A lithographic apparatus comprising:
   an illumination system for providing a beam of radiation;
   a support structure for supporting a patterning device, the patterning device serving to impart the radiation beam with a pattern in its cross-section;
   a substrate table for holding a substrate;
   a projection system for projecting the patterned radiation beam onto a target portion of the substrate; and
   a controller arranged to control at least a part of the lithographic apparatus to ensure that an alignment mark that is to be provided on an area of a layer provided on the substrate is provided on an area which is oriented within a specified range of angles with respect to a surface of the substrate on which the layer is provided by:
   for each of a plurality of potential alignment mark positions on the layer determining respective angles of orientation of the layer with respect to a surface of the substrate;
   determining, for each of the respective angles of orientation, whether the layer is oriented within a specified range of angles with respect to the surface of the substrate at each respective associated potential alignment mark position; and
   providing the alignment marks at each potential alignment mark position for which the layer is oriented within the specified range of angles, and not providing alignment marks on each potential alignment mark position for which the layer is oriented outside the specified range of angles.

* * * * *